United States Patent [19]

Sugawara

[11] Patent Number: 5,487,963
[45] Date of Patent: Jan. 30, 1996

[54] PHASE SHIFTING MASK WHEREIN LIGHT TRANSMITTED THROUGH SECOND TRANSMISSION AREAS INTENSIFIES LIGHT THROUGH FIRST TRANSMISSION AREAS

[75] Inventor: Minoru Sugawara, Kanagawa, Japan

[73] Assignee: Sony Corporation, Tokyo, Japan

[21] Appl. No.: 296,461

[22] Filed: Aug. 26, 1994

[30] Foreign Application Priority Data

Aug. 27, 1993 [JP] Japan ................................. 5-235561

[51] Int. Cl.⁶ ..................................................... G03F 9/00
[52] U.S. Cl. ............................ 430/5; 430/312; 430/313; 430/314
[58] Field of Search ............................ 430/5, 312, 313, 430/314

[56] References Cited

U.S. PATENT DOCUMENTS

5,364,716 11/1994 Nakagawa et al. ..................... 430/5

*Primary Examiner*—S. Rosasco
*Attorney, Agent, or Firm*—Ronald P. Kananen

[57] ABSTRACT

An improved phase shifting mask suitable to form rectangular isolated fine patterns of a repetitive arrangement of a fine structure is disclosed. The phase shifting mask includes square patterns forming first and second light transmission areas disposed alternately and repetitively so that the ratio between the pattern width of the light transmission areas and the distance between the centers of the patterns may be about 1:2. The second light transmission areas provide transmission light having a phase different by 180 degrees from that of transmission light through the first light transmission areas. Interference of the transmission light through the two different kinds of areas reduces the intensity of light outside the patterns to enhance the resolution. Further, side lobe light intensifies the intensity of main lobe light of an adjacent pattern so that it contributes to formation of a good pattern. The phase shifting mask can be applied to formation of contact holes of a semiconductor integrated circuit which are a repeat pattern of a fine structure.

8 Claims, 7 Drawing Sheets

PHASE SHIFTING MASK WHEREIN LIGHT TRANSMITTED THROUGH SECOND TRANSMISSION AREAS INTENSIFIES LIGHT THROUGH FIRST TRANSMISSION AREAS

BACKGROUND OF THE INVENTION

This invention relates to a phase shifting mask and an exposure method in which the phase shifting mask is used, and more particularly to a phase shifting mask which can be used with various pattern formation techniques and allows formation of a resist pattern on a wafer with a high yield upon production of, for example, semiconductor devices.

In semiconductor devices, the working dimensions of patterns progressively become finer year by year, and such fine patterns cannot be resolved sufficiently with conventional photo-masks which are constituted only from a light shielding area and light transmission areas. Therefore, a phase shifting mask with which a fine pattern which cannot be resolved with any conventional mask can be resolved is spotlighted in place of conventional photo-masks. The phase shifting mask has an ordinary first light transmission area for formation of a pattern, and an auxiliary second light transmission area which provides transmission light having a phase different by 180 degrees from that of transmission light through the first light transmission area.

When it is tried to use a phase shifting mask for formation of isolated patterns as represented by, for example, contact holes, several phase shifting masks including a phase shifting mask of the outrigger type in which an auxiliary pattern which provides transmission light having a phase relatively different by 180 degrees from that of transmission light through a main pattern is disposed in the proximity of the main pattern, another phase shifting mask of the rim type in which a similar auxiliary pattern is disposed adjacent a main pattern and a further phase shifting mask of the attenuated type in which a light semi-shielding portion which provides semi-transmission light having a phase relatively different by 180 degrees from that of transmission light through a main pattern is provided are principally employed. Those conventional phase shifting masks can be applied where patterns are not disposed comparatively densely, and provide remarkable enhancements in resolution and depth of focus comparing with conventional masks.

The conventional phase shifting masks of the types described above are disadvantageous in the following points when it is tried to form a large number of rectangular isolated patterns arranged comparatively densely.

In particular, the phase shifting masks of the outrigger type and the rim type are disadvantageous in that, since the width of a masking area necessary for formation of a single rectangular pattern is greater than twice the width of the pattern on the mask, it is difficult to reduce the distance (hereinafter referred to as pattern distance) between two adjacent patterns on a wafer and particularly it is impossible in principle to dispose rectangular patterns at such a small distance with which the pattern width and the distance between the centers of adjacent patterns in the light transmission area exhibit a ratio of 1:2.

On the other hand, although the phase shifting mask of the attenuated type allows an arrangement of patterns in which the pattern width and the distance between the centers of adjacent patterns in the light transmission area exhibit a ratio of 1:2, it is disadvantageous in that, since side lobe light of a pattern upon operation to transfer of a masking pattern onto a wafer is overlapped with main lobe light of an adjacent pattern and besides the side lobe light and the main lobe light are different by 180 degrees in phase from each other, the side lobe light remarkably reduces the original effect of a phase shift and formation of a good pattern is disturbed.

It is to be noted that, also with conventional masks which do not employ phase shifting, since side lobe light of a pattern is overlapped with main lobe light of an adjacent pattern and besides the side lobe light and the main lobe light are relatively different by 180 degrees in phase from each other, the side lobe light disturbs formation of a good pattern similarly as described above. Therefore, conventionally it is particularly difficult to dispose fine rectangular patterns so that the ratio between the pattern width and the distance between the centers of adjacent patterns in the light transmission area may be substantially 1:2.

SUMMARY OF THE INVENTION

It is an object of the present invention to provide a phase shifting mask with which good fine patterns can be formed, upon formation of a rectangular repeat pattern, even where fine rectangular patterns for contact holes or the like are disposed at small distances.

In order to attain the object described above, according to an aspect of the present invention, there is provided a phase shifting mask which comprises a transparent substrate, a light shielding area formed on the transparent substrate, a plurality of first light transmission areas of a rectangular shape patterned on the transparent substrate, and a plurality of second light transmission areas patterned in an alternate relationship in two perpendicular directions on the transparent substrate, the second light transmission areas being constructed so that light having transmitted therethrough intensifies the intensity of light having transmitted through the first light transmission areas, the second light transmission areas having a substantially same profile as that of the first light transmission areas.

With the phase shifting mask, since the first light transmission areas and the second light transmission areas are disposed alternately in the two perpendicular directions, light having transmitted through the first light transmission areas and light having transmitted through the second light transmission areas weaken the intensities of each other in any area other than the patterns. Consequently, the resolution and the depth of focus of patterns formed by light having transmitted through the first and second light transmission areas can be enhanced.

Further, the defect of the conventional masks that side lobe light of a pattern is overlapped with main lobe light of an adjacent pattern to disturb formation of a good pattern is eliminated with the phase shifting mask of the present invention since, due to the fact that side lobe light of a pattern and main lobe light of an adjacent pattern have a same phase, light having transmitted through the first and second light transmission areas intensifies each other in intensity in adjacent patterns and side lobe light contributes to formation of good patterns conversely to the conventional masks.

Preferably, the ratio between the width of the patterns of the first and second light transmission areas and the distance between the centers of the patterns is within the range from about 1:1.6 to about 1:2.5, and more preferably, from about 1:1.8 to about 1:2.2. The specific ratio enhances the advantage described above that light having transmitted through the first light transmission areas and light having transmitted through the second light transmission areas intensify each other in intensity in the individual patterns but weaken each other in intensity in any area other than the patterns.

Preferably, the second light transmission areas are constructed so that light having transmitted therethrough has a phase different by 180 degrees from that of light having transmitted through the first light transmission areas.

Preferably, the rectangular shape is the square shape. This enables selection of such arrangement of the first and second light transmission areas in the two perpendicular directions as will provide best enhancements in resolution and depth of focus arising from interference of transmission light through the areas for predetermined exposure condition.

In summary, with the phase shifting mask according to the present invention, since formation of rectangular patterns of a fine structure by exposure is performed well due to interference between light having transmitted through the first light transmission areas and light having transmitted through the second light transmission areas, the phase shifting mask is very advantageous in that it facilitates production of highly integrated semiconductor devices or like devices.

According to another aspect of the present invention, there is provided an exposure method, which comprises the single step of performing exposure using the phase shifting mask set forth as above.

With the exposure method, rectangular patterns of a fine structure can be formed well as described above.

The above and other objects, features and advantages of the present invention will become apparent from the following description and the appended claims, taken in conjunction with the accompanying drawings in which like parts or elements are denoted by like reference characters.

DETAILED DESCRIPTION OF THE PREFERRED EMBODIMENTS

Figure 1:
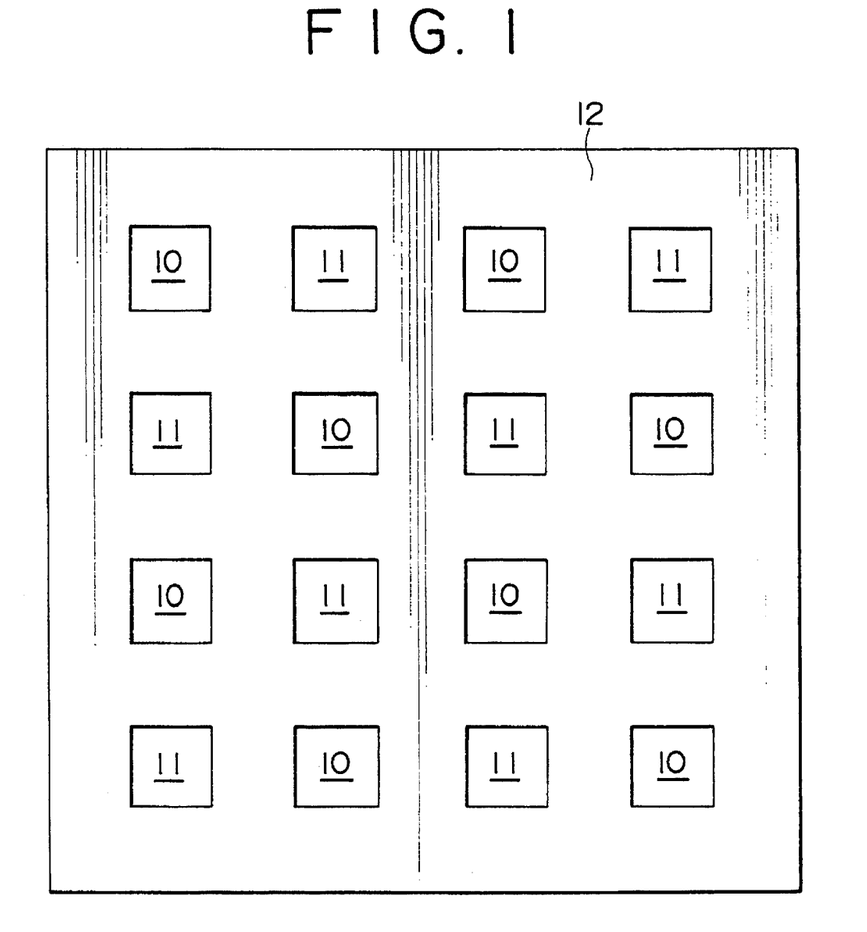
FIG. 1 is a schematic plan view of a phase shifting mask to which the present invention is applied.
Figure 2:
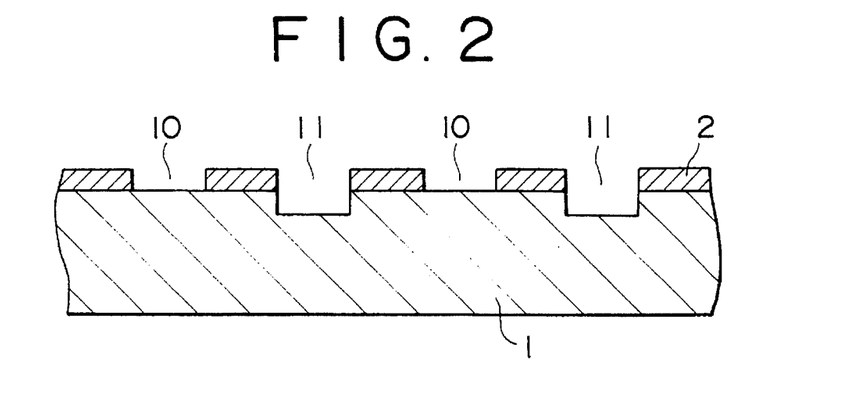
FIG. 2 is a schematic cross sectional view of the phase shifting-mask shown in FIG. 1.

Referring first to FIGS. 1 and 2, there is shown a phase shifting mask to which the present invention is applied. The phase shifting mask shown has a plurality of first light transmission areas 10 of a square shape and a plurality of second light transmission areas 11 of a square shape disposed alternately in two perpendicular directions, that is, in vertical and horizontal directions in FIG. 1, in an entire area thereof including a light shielding area 12. The second light transmission areas 11 have a same size as the first light transmission areas 10 and provide transmission light having a phase different by 180 degrees from that of transmission light through the first light transmission areas 10. The ratio between the width of the patterns of the square light transmission areas and the distance between the centers of the patterns is selected to be 1:2 in the vertical and horizontal directions.

As particularly seen from FIG. 2, the square first and second light transmission areas 10 and 11 are formed from a light shielding film 2 formed on a substrate 1. The first light transmission areas 10 are formed as ordinary light transmission areas while the second light transmission areas 11 are formed as phase shifting areas by etching the substrate 1. It is to be noted that it is otherwise possible to form the second light transmission areas 11 from a phase shifting material which can provide a phase shift to light transmitted therethrough.

Further, while the second light transmission areas 11 in the phase shifting mask of the present invention may be called phase shifting areas for convenience of description, actually the phase shifting amount between the first light transmission areas 10 and the second light transmission areas 11 is defined by a relative phase relationship between transmission light through aimed ones of the two kinds of areas and transmission light through the other areas.

In the following, phase shifting masks of several examples produced experimentally in accordance with the present invention and phase shifting masks of comparative examples produced experimentally for contrast with the examples will be described below in regard to the structures, the production methods and results of exposure of them.

EXAMPLE 1

In the phase shifting mask of the Example 1, the second light transmission areas 11 which serve as phase shifting areas are formed, for example, from SOG (spin-on glass). The thickness d of an SOG film to be formed on a substrate is determined so that it may satisfy the expression $d=\lambda/(2(n-1))$ where $\lambda$ is the wavelength of exposure light, and n is the refractive index of the SOG. Due to the construction, light having transmitted through the first light transmission areas 10 and light having transmitted through the second light transmission areas 11 are different in phase by 180 degrees from each other.

Figure 3A:
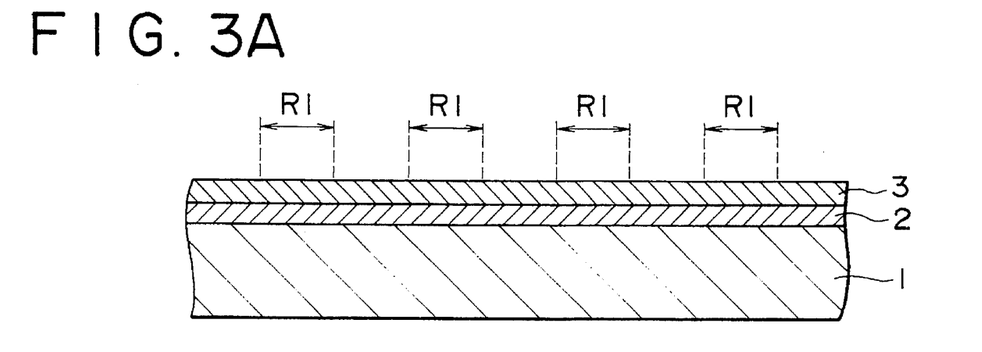
FIGS. 3A to 3D and FIGS. 4A to 4D are schematic cross sectional views illustrating successive steps of production of a first example of phase shifting mask according to the present invention.

FIGS. 3A to 3D and 4A to 4D illustrate successive steps of the process by which the phase shifting mask of the Example 1 was produced actually. It is to be noted that, in the Example 1, a positive type resist was adopted and dry etching was adopted for all etching steps. A light shielding film 2 of chrome was formed by sputtering on a substrate 1 made of quartz and a resist 3 was applied to the light shielding film 2 to obtain such a structure as shown in FIG. 3A.

Figure 3B:
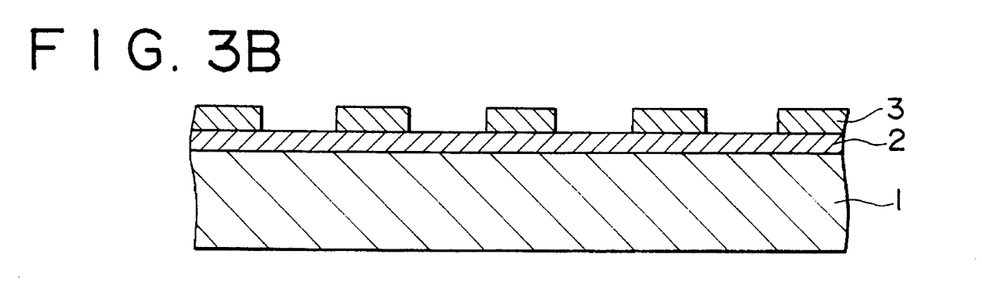
Figure 3C:
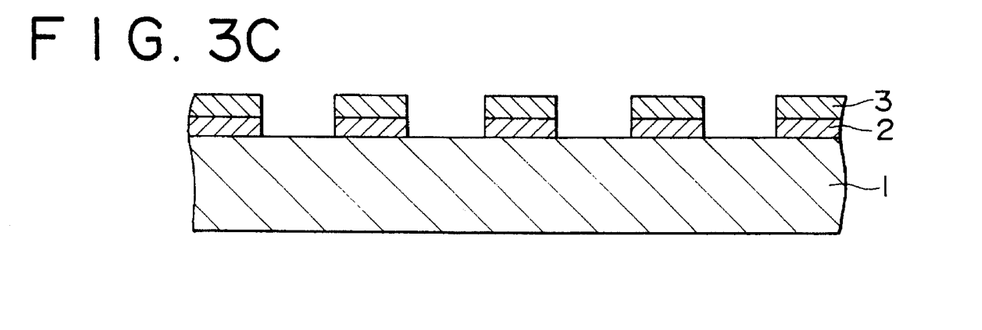
Figure 3D:
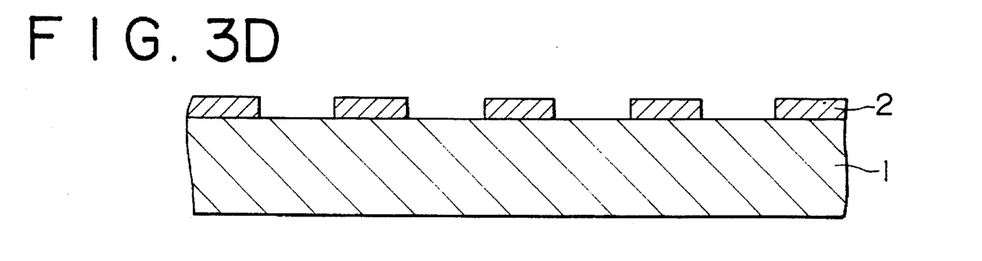

Then, for a first drawing step by an electron-beam exposure system, drawing areas R1 were set as shown in FIG. 3A, and an electron beam accelerated with the acceleration voltage of 20 kV was irradiated to effect drawing. Then, a development step of the resist by an electron beam was performed to obtain such a structure as shown in FIG. 3B. The thickness of the resist 3 after the development was 400 nm. Thereafter, the light shielding film 2 of chrome was etched by plasma etching using mixture gas of chlorine and oxygen to obtain such a structure as shown in FIG. 3C. In the plasma etching, the etching rate of the chrome was 30 nm per one minute. Subsequently, the resist 3 was stripped to obtain the structure of FIG. 3D.

Subsequently, adopting SOG as the phase shifting material, a SOG layer 4 was formed by applying SOG so that the film thickness d thereof may be $d=\lambda/(2(n-1))$ in order to realize a phase shift of 180 degrees. Then, a resist 3' was applied to the SOG layer 4, and further, in order to prevent charge-up, a conductive film 5 was formed on the resist 3' to obtain such a structure as shown in FIG. 4A.

Figure 4A:
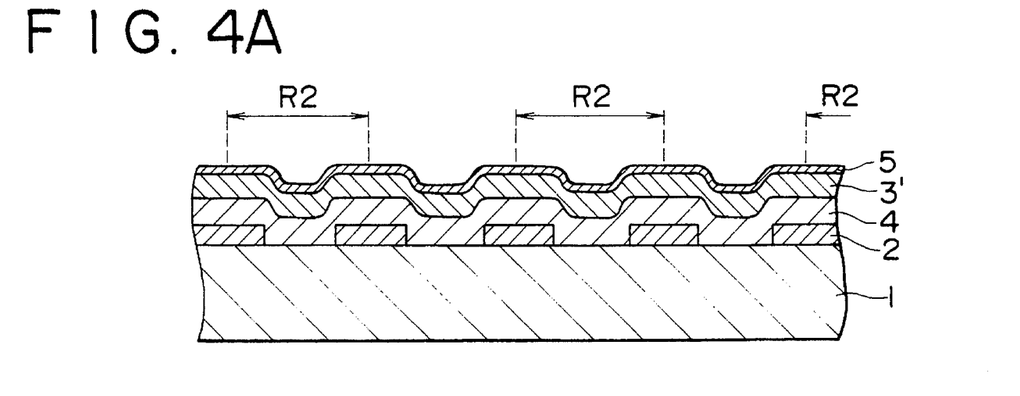
Figure 4B:
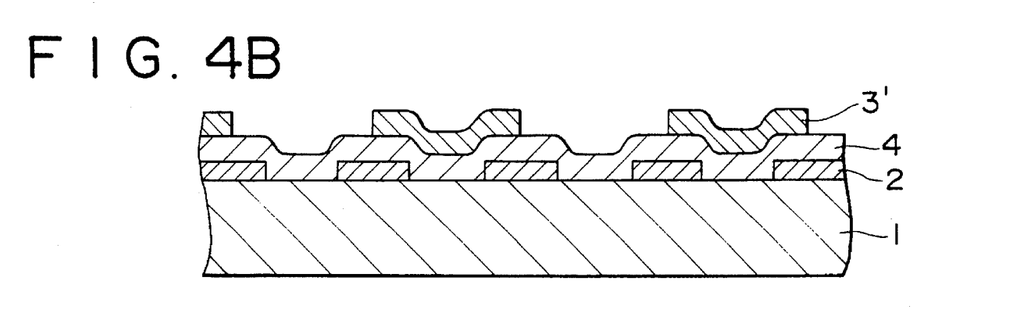
Figure 4C:
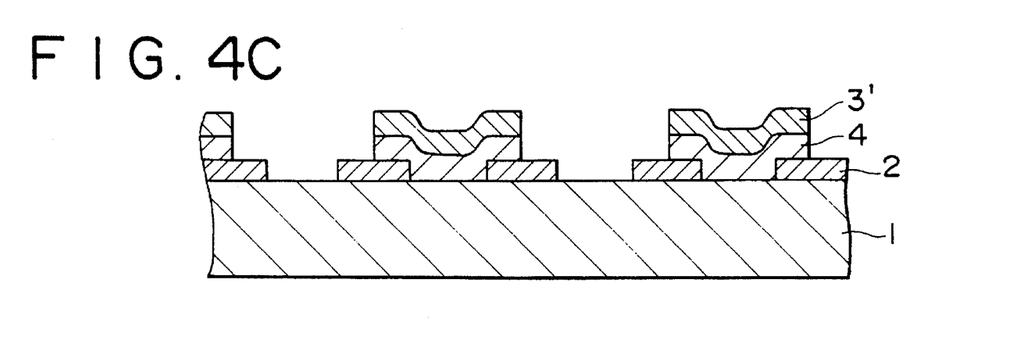
Figure 4D:
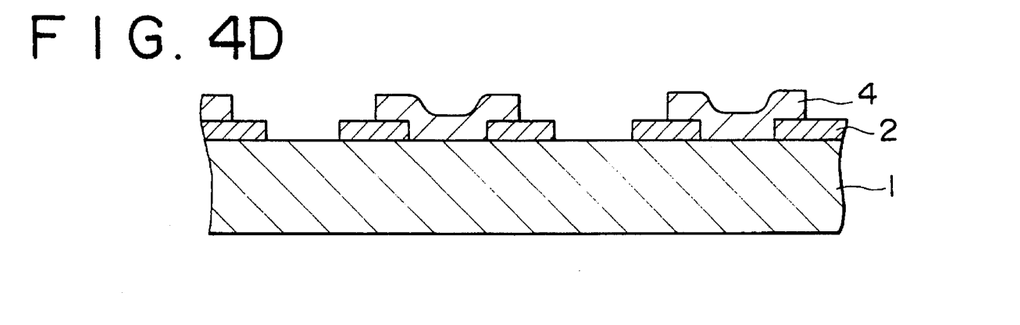

Then, for a second drawing step by the electron-beam exposure system, drawing areas R2 were set as shown in FIG. 4A, and an electron beam accelerated with the acceleration voltage of 20 kV was irradiated to effect drawing. Then, a development step of the resist by an electron beam was performed to obtain such a structure as shown in FIG. 4B. Thereafter, the SOG layer 4 was etched by plasma etching using trifluoromethane to obtain such a structure as shown in FIG. 4C. The etching rate of the SOG layer 4 with trifluoromethane was 60 nm per one minute. Thereafter, the resist was stripped to obtain such a structure as shown in FIG. 4d.

Adopting the phase shifting mask of the Example 1 produced in such a manner as described above, square patterns of such an arrangement as shown in FIG. 1 was formed by exposure using a five-time reduction step-and-repeat projection printer or so-called stepper wherein exposure is performed with a KrF excimer laser (wavelength: 248 nm) whose partial coherency is 0.3 and whose NA (Numerical Aperture) is 0.45. When the length of one side of the square patterns was 1.5 μm on the mask and the focus offset was 0 μm, the intensity of light on the wafer was 0.809 and the size of the patterns obtained was 0.32 μm. On the other hand, when the focus offset was increased to 0.75 μm, the intensity of light on the wafer was 0.746 and the size of the patterns obtained was 0.33 μm. No second light intensity distribution was produced in any other portion than the pattern formation areas, and good pattern formation was performed. It is to be noted that the sizes of the patterns were measured using an electron beam metrology system.

Comparative Example 1

Adopting a phase shifting mask of the attenuated type having a light semi-shielding area having an amplitude transmittance factor of 0.4, square patterns of such an arrangement as shown in FIG. 1 was formed by exposure using the five-time reduction step-and-repeat projection printer wherein exposure was performed with a KrF excimer laser (wavelength: 248 nm) whose partial coherency is 0.3 and whose NA (Numerical Aperture) is 0.45. Using square patterns (whose one side on a five-time reticule was 1.85 μm) of a size with which patterns having a substantially same size as that of the phase shifting mask of the Example 1 can be formed by exposure where the pattern distance was greater than the pattern distance of an arrangement in which the ratio described above was 1:4 with which substantially no interference of light occurred between adjacent patterns. When the focus offset was 0 μm, the intensity of light on the wafer was 0.612 and the size of the patterns obtained was 0.28 μm. On the other hand, when the focus offset was increased to 0.75 μm, the intensity of light on the wafer was 0.466 and the size of the patterns obtained was 0.22 μm.

In this manner, with the Comparative Example 1, when the focus offset was increased, the intensity of light exhibited a considerable reduction and the pattern width was decreased remarkably accordingly, resulting in failure of formation of good patterns. Further, at some location on the wafer other than the pattern formation areas, a second light intensity distribution whose intensity of light was equal to or greater than 0.3 was produced by a light proximity effect, resulting in occurrence of a drawback that a resist at a location where it should not originally have been exposed to light was sensitized by light.

Comparative Example 2

Adopting a conventional mask, square patterns of such an arrangement as shown in FIG. 1 were formed by exposure using the five-time reduction step-and-repeat projection printer wherein exposure was performed with a KrF excimer laser (wavelength: 248 nm) whose partial coherency is 0.3 and whose NA (Numerical Aperture) is 0.45. Where square patterns whose one side on the five-time reticule was 1.5 μm was used, when the focus offset was 0 μm, the intensity of light on the wafer was 0.424 and the size of the patterns obtained was 0.22 μm. On the other hand, when the focus offset was increased to 0.75 μm, the intensity of light on the wafer reduced to 0.271 and formation of patterns itself was impossible.

EXAMPLE 2

The phase shifting mask of the Example 2 is a modification to the phase shifting mask of the Example 1. FIGS. 5A to 5D and 6A to 6D illustrate successive steps of the process by which the phase shifting mask of the Example 2 was produced. The phase shifting mask of the Example 2 is different from the phase shifting mask of the Example 1 in that the SOG layer 4 is formed under the light shielding film 2. Consequently, also the method of manufacturing the mask is different. Also in the production of the phase shifting mask of the Example 2, a positive type resist was adopted and dry etching was adopted for all etching steps.

Figure 5A:
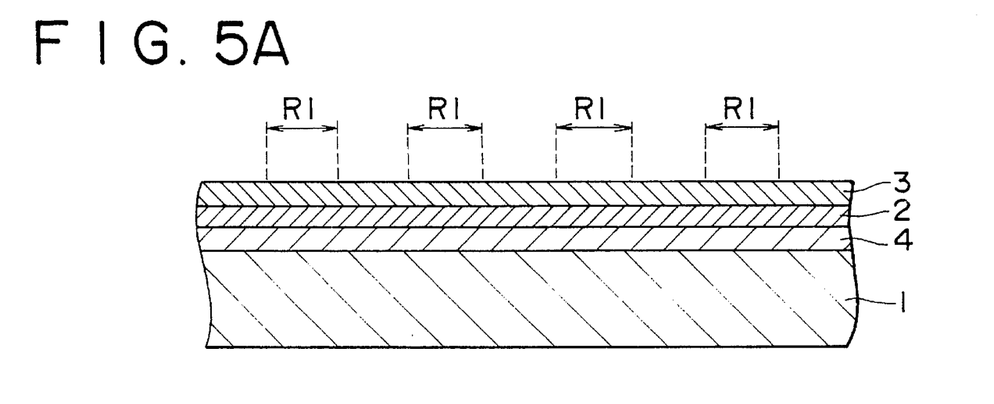
FIGS. 5A to 5D and FIGS. 6A to 6D are similar views but illustrating successive steps of production of a second example of phase shifting mask according to the present invention.
Figure 5B:
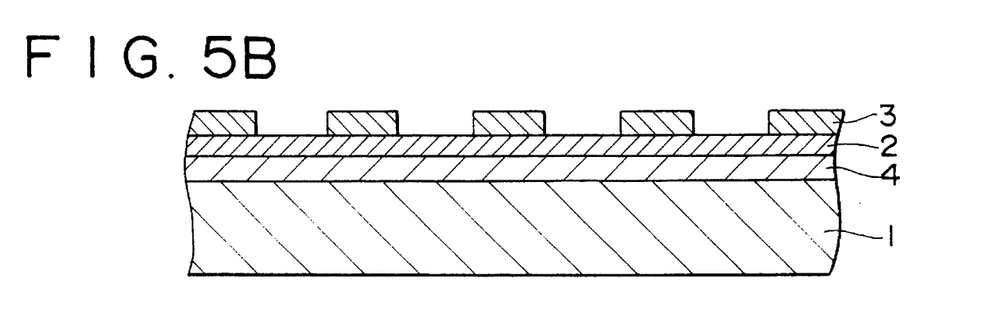
Figure 5C:
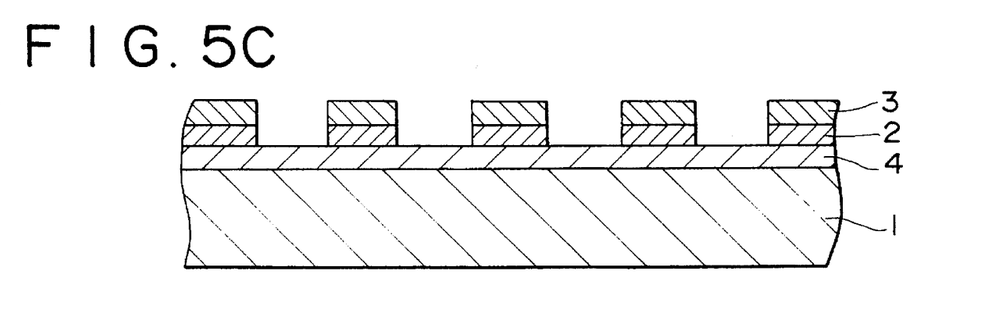
Figure 5D:
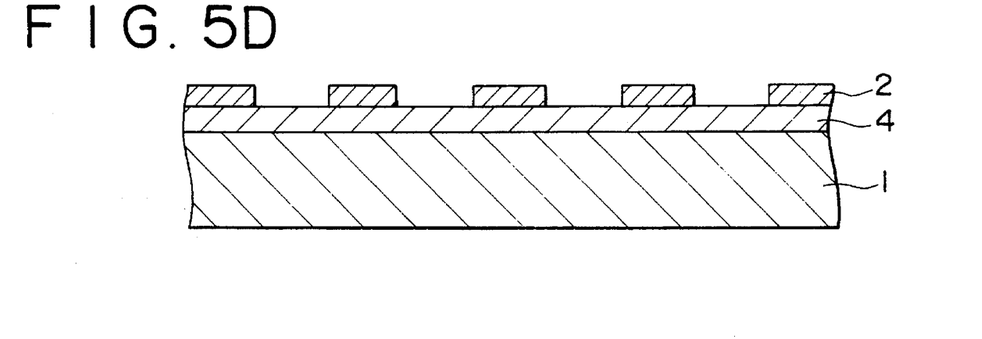

SOG was selected as the phase shifting material, and a SOG layer 4 was applied to a substrate 1 made of quartz so that the thickness d thereof might satisfy the expression $d=\lambda/(2(n-1))$ given hereinabove in order to realize a phase shift of 180 degrees. Then, a light shielding film 2 of chrome was formed by sputtering on the SOG layer 4, and a resist 3 was applied to the light shielding film 2 to obtain such a structure as shown in FIG. 5A. Then, for the first drawing step by the electron-beam exposure system, drawing areas R1 were set as shown in FIG. 5A, and an electron beam accelerated with the acceleration voltage of 20 kV was irradiated to effect drawing. Then, a development step of the resist by an electron beam was performed to obtain such a structure as shown in FIG. 5B. The thickness of the resist 3 after the development was 400 nm. Thereafter, the light shielding film 2 of chrome was etched by plasma etching using mixture gas of chlorine and oxygen to obtain such a structure as shown in FIG. 5C. In the plasma etching, the etching rate of the chrome was 30 nm per one minute. Subsequently, the resist 3 was stripped to obtain the structure of FIG. 5D.

Figure 6A:
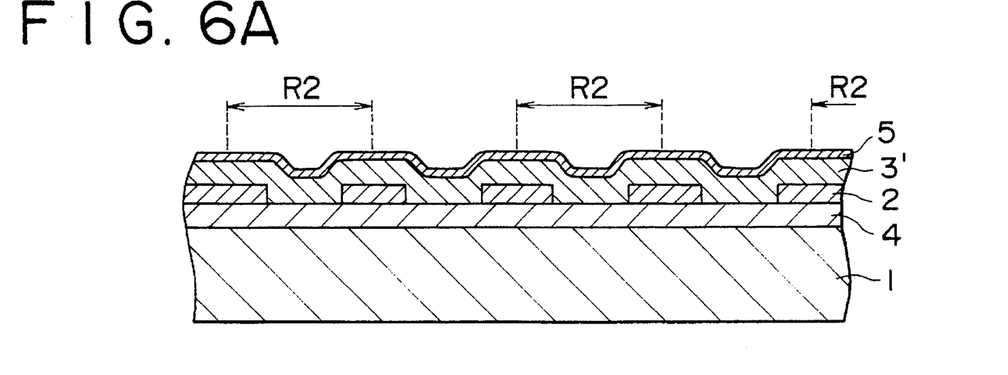
Figure 6B:
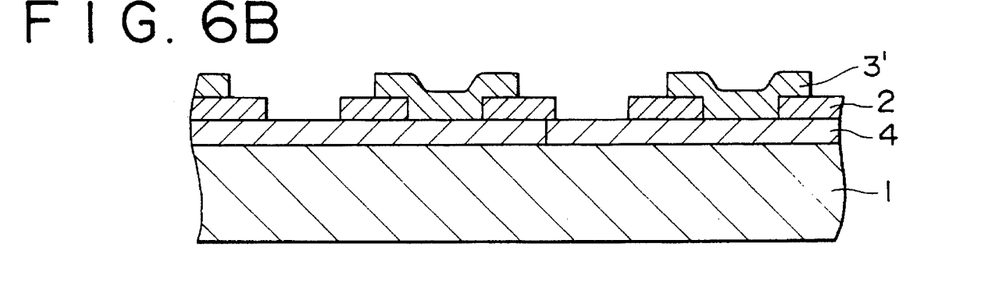
Figure 6C:
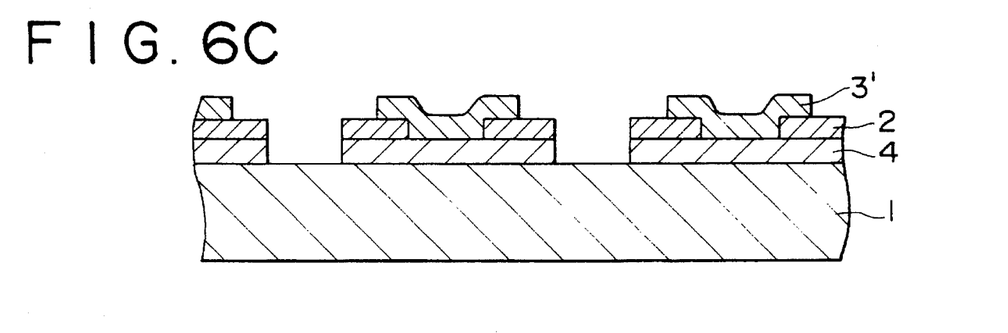
Figure 6D:
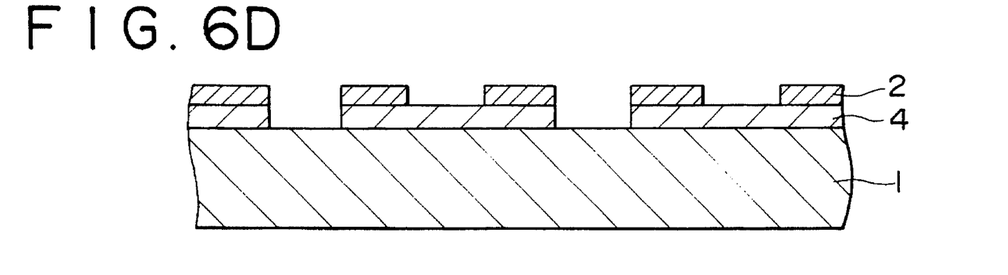

Subsequently, a resist 3' was coated, and further, in order to prevent charge-up, a conductive film 5 was formed on the resist 3' to obtain such a structure as shown in FIG. 6A. Then, for the second drawing step by the electron-beam exposure system, drawing areas R2 were set as shown in FIG. 6A, and an electron beam accelerated with the acceleration voltage of 20 kV was irradiated to effect drawing. Then, the development step of the resist by an electron beam was performed to obtain such a structure as shown in FIG. 6B. Thereafter, the SOG layer 4 was etched by plasma etching using trifluoromethane to obtain such a structure as shown in FIG. 6C. The etching rate of the SOG layer 4 with trifluoromethane was 60 nm per one minute. Thereafter, the resist was stripped to obtain such a structure as shown in FIG. 6d.

Adopting the phase shifting mask of the Example 2 produced in such a manner as described above, square patterns of such an arrangement as shown in FIG. 1 were formed by exposure using the five-time reduction step-and-repeat projection printer wherein exposure is performed with a KrF excimer laser (wavelength: 248 nm) whose partial coherency is 0.3 and whose NA (Numerical Aperture) is 0.45. Also in this instance, good patterns similar to those obtained where the phase shifting mask of the Example 1 was employed was obtained.

EXAMPLE 3

The phase shifting mask of the Example 3 similarly is a modification to the phase shifting mask of the Example 1. The phase shifting mask of the Example 3 is different from the phase shifting mask of the Example 1 in that the second light transmission areas 11 which serve as phase shifting areas are formed by etching of a glass substrate. Consequently, the method of manufacturing the mask is different.

Figure 7A:
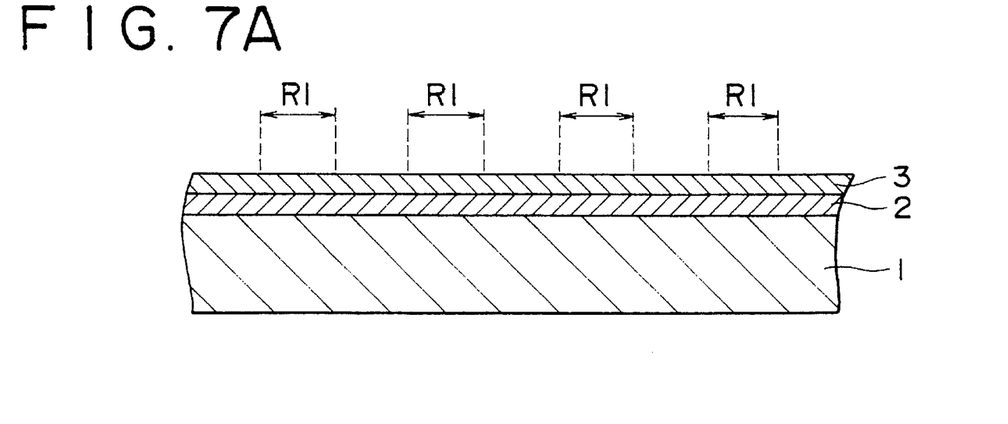
FIGS. 7A to 7D and FIGS. 8A to 8D are similar views but illustrating successive steps of production of a third example of phase shifting mask according to the present invention.
Figure 7B:
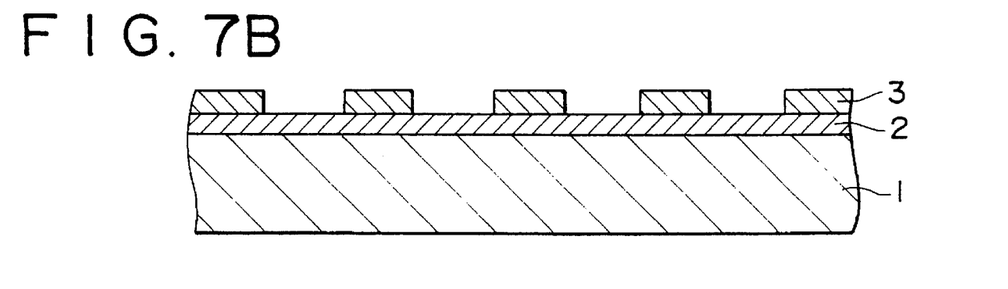
Figure 7C:
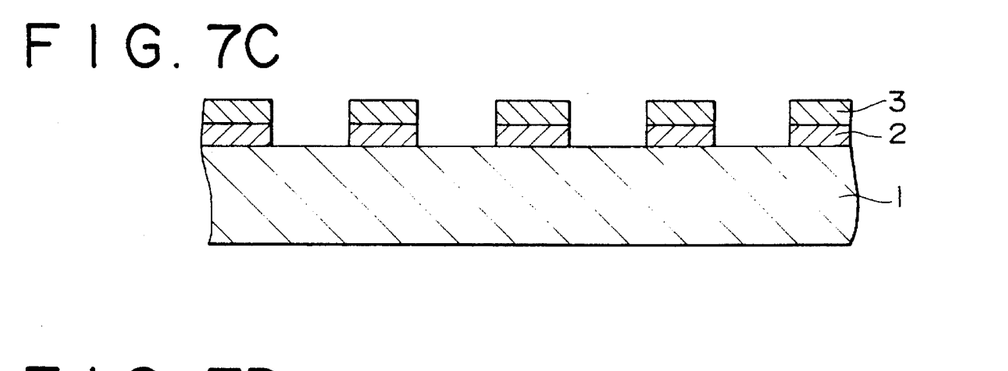
Figure 7D:
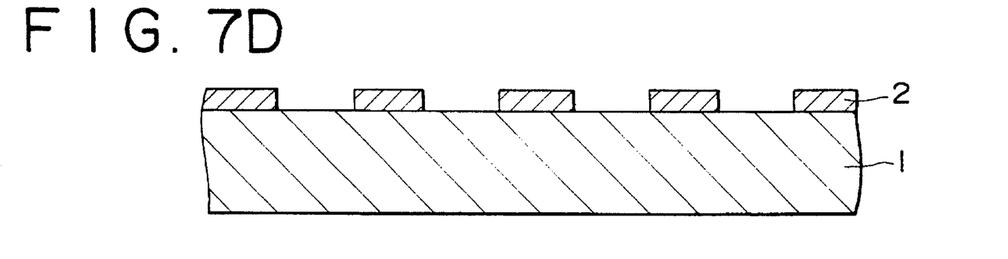

FIGS. 7A to 7D and 8A to 8D illustrate successive steps of the process by which the phase shifting mask of the Example 3 was produced. It is to be noted that, in the Example 3, a positive type resist was adopted and dry etching was adopted for all etching steps. A light shielding film 2 of chrome was formed by sputtering on a substrate 1 made of quartz and a resist 3 was coated on the light shielding film 2 to obtain such a structure as shown in FIG. 7A. Then, for the first drawing step by the electron-beam exposure system, drawing areas R1 were set as shown in FIG. 7A, and an electron beam accelerated with the acceleration voltage of 20 kV was irradiated to effect drawing. Then, the development step of the resist by an electron beam was performed to obtain such a structure as shown in FIG. 7B. The thickness of the resist 3 after the development was 400 nm. Thereafter, the light shielding film 2 of chrome was etched by plasma etching using mixture gas of chlorine and oxygen to obtain such a structure as shown in FIG. 7C. In the plasma etching, the etching rate of the chrome was 30 nm per one minute. Subsequently, the resist was stripped to obtain the structure of FIG. 7D.

Figure 8A:
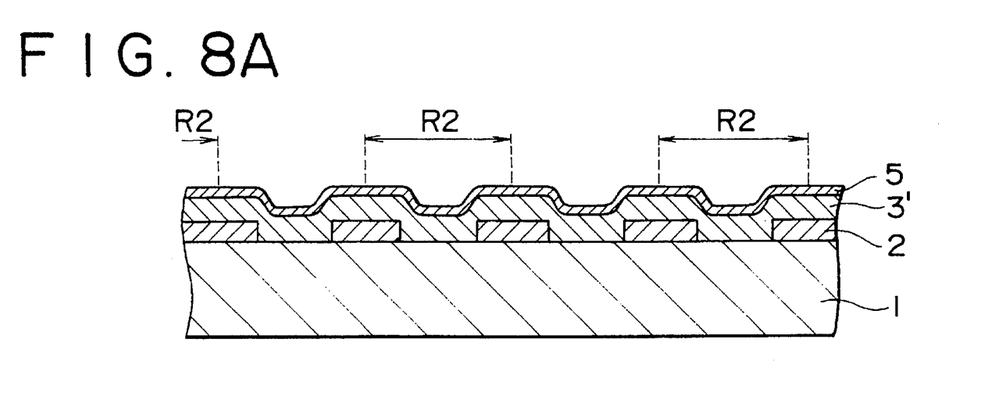
Figure 8B:
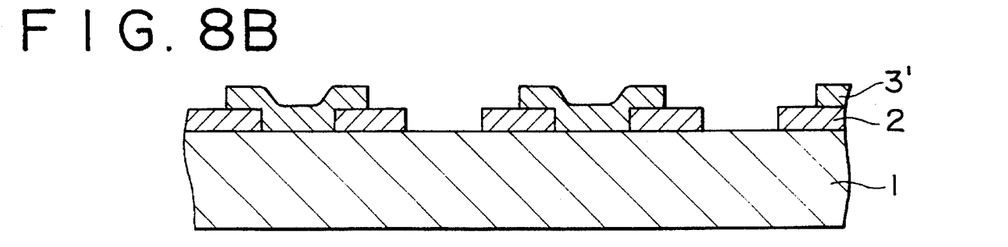
Figure 8C:
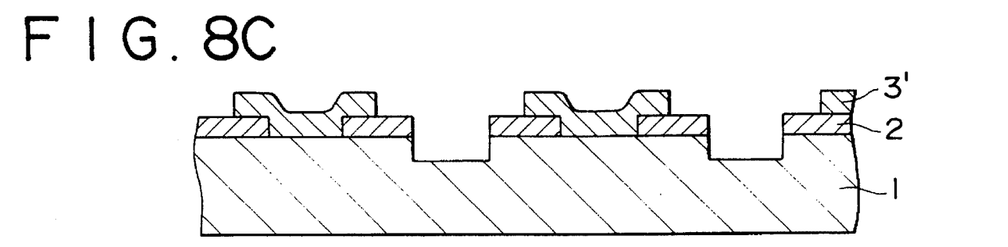
Figure 8D:
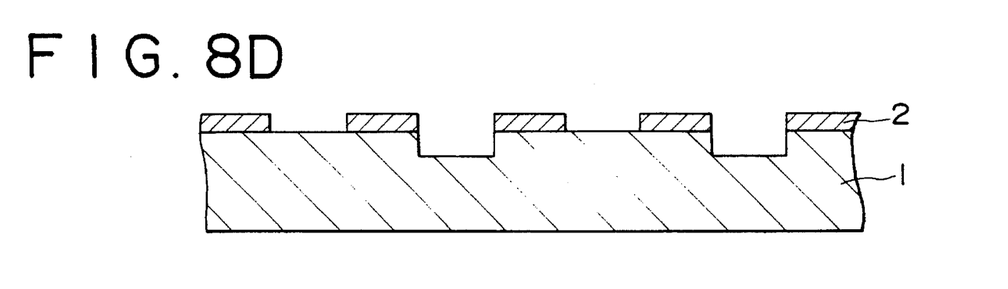

Subsequently, a resist 3' was coated, and further, in order to prevent charge-up, a conductive film 5 was formed on the resist 3' to obtain such a structure as shown in FIG. 8A. Then, for the second drawing step by the electron-beam exposure system, drawing areas R2 were set as shown in FIG. 8A, and an electron beam accelerated with the acceleration voltage of 20 kV was irradiated to effect drawing. Then, the development step o the resist by an electron beam was performed to obtain such a structure as shown in FIG. 8B. Thereafter, in order to realize a phase shift of 180 degrees, the glass substrate was etched by plasma etching in plasma of trifluoromethane so that the etching depth d thereof satisfies the expression $d = \lambda(2(n-1))$ to obtain such a structure as shown in FIG. 8C. It is to be noted that n in the expression given just above is -he refractive index of the substrate 1. Thereafter, the resist was stripped to obtain such a structure as shown in FIG. 8D.

Adopting the phase shifting mask of the Example 3 produced in such a manner as described above, square patterns of such an arrangement as shown in FIG. 1 were formed by exposure using the five-time reduction step-and-repeat projection printer wherein exposure is performed with the KrF excimer laser (wavelength: 248 nm) whose partial coherency is 0.3 and whose NA (Numerical Aperture) is 0.45. Consequently, good patterns as those in the Example 1 were obtained.

While a positive type resist is employed in the processes of production of all of the phase shifting masks of the different examples described above, the resist is not limited particularly to a positive type resist, but a negative type resist may be employed instead. In this instance, the electron beam drawing areas are reverse to those obtained with a positive resist adopted in the examples of the present invention described above. Meanwhile, the shifting material for realizing a phase shifting difference is not particularly limited to SOG, but may be any transparent film of any material such as a resist or silicon nitride. Further, he material of the light shielding film is not particularly limited to chrome, and any other light shielding material such as, for example, aluminum or metal silicide may be employed.

As described above, where a phase shifting mask according to the present invention is adopted, light having been transmitted through first light transmission areas and light having been transmitted through second light transmission areas intensify each other in intensity in patterns but weaken each other in intensity outside the patterns due to destructive interference between them. Consequently, the resolution in the patterns is enhanced. Further, even if the focus offset is increased, the variation in pattern width remains little and besides the proximity effect of light occurs less likely. Accordingly, good patterns can be formed.

As the ratio between the pattern width and the distance between the centers of patterns in the light transmission areas, the range from about 1:1.6 to about 1:2.5 is adopted preferably for enhancement of the resolution, and more preferably, the range of the ratio from about 1:1.8 to about 1:2.2 is adopted. The resolution was very good with square patterns arranged so as to exhibit the ratio of 1:2 between the pattern width and the centers of patterns in the light transmission area, which are described in connection with the examples of the present invention. Therefore, where the phase shifting masks of the examples described above are employed, contact holes of a fine construction particularly arranged densely can be formed readily, for example, in a semiconductor integrated circuit.

It is to be noted that, since a phase shifting mask according to the present invention relies upon the basic idea that the intensity of light outside patterns is reduced by interference between light having transmitted through first light transmission areas and light having transmitted through second light transmission areas thereby to enhance the resolution, the second light transmission areas are required to be constructed relative to the first light transmission areas only so that light having transmitted therethrough may intensify the intensity of light having transmitted through the first light transmission areas. For example, the second light transmission areas are constructed so that light having transmitted therethrough may have a phase different by 180 degrees from that of light having transmitted through the first light transmission areas.

Having now fully described the invention, it will be apparent to one of ordinary skill in the art that many changes and modifications can be made thereto without departing from the spirit and scope of the invention as set forth herein.

What is claimed is:

1. A phase shifting mask, comprising:
a transparent substrate;

a light shielding area formed on said transparent substrate;

a plurality of first light transmission areas of a rectangular shape patterned on said transparent substrate; and a plurality of second light transmision areas patterned in an alternate relationship in two perpendicular directions from said first light transmision areas on said transparent substrate, said second light transmission areas being spaced from said first light transmission areas and constructed so that light having transmitted through said second light transmission areas intensifies the intensity of light having transmitted through said first light transmission areas, said second light transmission areas having a substantially same profile as that of said first light transmission areas.

2. A phase shifting mask according to claim 1, wherein the ratio between the width of the patterns of said first and second light transmission areas and the distance between the centers of the patterns is within the range from about 1:1.6 to about 1:2.5.

3. A phase shifting mask according to claim 1, wherein the ratio between the width of the patterns of said first and second light transmission areas and the distance between the centers of the patterns is within the range from about 1:1.8 to about 1:2.2.

4. A phase shifting mask according to claim 1, wherein said second light transmission areas are constructed so that light having transmitted therethrough has a phase different by 180 degrees from that of light having transmitted through said first light transmission areas.

5. A phase shifting mask according to claim 1, wherein a rectangular shape is the square shape.

6. An exposure method, comprising the single step of performing exposure using a phase shifting mask which comprises a transparent substrate, a light shielding area formed on said transparent substrate, a plurality of first light transmission areas of a rectangular shape patterned on said transparent substrate, and a plurality of second light transmission areas patterned in an alternate relationship in two perpendicular directions from said first light transmission areas on said transparent substrate, said second light transmission areas being spaced from said first light transmission areas and constructed so that light having transmitted through said second light transmission intensifies the intensity of light having transmitted through said first light transmission areas, said second light transmission areas having a substantially same profile as that of said first light transmission areas.

7. An exposure method according to claim 6, wherein the ratio between the width of the patterns of said first and second light transmission areas and the distance between the centers of the patterns is within the range from about 1:1.6 to about 1:2.5.

8. An exposure method according to claim 6, wherein said second light transmission areas are constructed so that light having transmitted therethrough has a phase different by 180 degrees from that of light having transmitted through said first light transmission areas.

* * * * *